United States Patent [19]
Cronin et al.

[11] Patent Number: 5,759,911
[45] Date of Patent: Jun. 2, 1998

[54] SELF-ALIGNED METALLURGY

[75] Inventors: John Edward Cronin, Milton; Carter Welling Kaanta, Colchester, both of Vt.

[73] Assignee: International Business Machines Corporation, Armonk, N.Y.

[21] Appl. No.: 517,782

[22] Filed: Aug. 22, 1995

[51] Int. Cl.$^6$ .............................. H01L 21/28; H01L 21/31
[52] U.S. Cl. ..................... 438/622; 438/629; 438/633; 438/637; 438/947
[58] Field of Search ...................... 437/195, 228, 437/978; 438/622, 623, 624, 637, 638, 639, 696, 717, 947, 629, 633

[56] References Cited

U.S. PATENT DOCUMENTS

| | | | |
|---|---|---|---|
| 4,789,648 | 12/1988 | Chow et al. | 437/225 |
| 4,837,123 | 6/1989 | Kato et al. | 430/269 |
| 4,921,723 | 5/1990 | Nichols et al. | 427/41 |
| 5,081,060 | 1/1992 | Kim | 437/52 |
| 5,100,838 | 3/1992 | Dennison | 437/195 |
| 5,106,780 | 4/1992 | Higuchi | 437/189 |
| 5,118,382 | 6/1992 | Cronin et al. | 156/643 |
| 5,144,411 | 9/1992 | Kaanta et al. | 357/68 |
| 5,286,674 | 2/1994 | Roth et al. | 437/190 |
| 5,525,552 | 6/1996 | Huang | 437/41 |
| 5,663,101 | 9/1997 | Cronin | 438/637 |

OTHER PUBLICATIONS

Kaanta, C., et al., "Dual Damascene: A ULSI Wiring Technology", Jun. 11–12, 1991 VMIC Conf., pp. 144–152.
"Module Protection, C4 Life Extension and Chip Reworkability Using Parylene", Babich et al., *IBM Technical Disclosure Bulletin*, vol. 34, No. 2, p. 143 (Jul. 1991).
"Line and Via Interconnect Structure Using a Single Mask", Cronin et al., *IBM Technical Disclosure Bulletin*, vol. 32, No. 12, p. 146 (May 1990).
"Thin Film Capacitors", Maissel et al., *Handbook of Thin Film Technology*, pp. 19–26–19–27 (1970).

*Primary Examiner*—T. N. Quach
*Attorney, Agent, or Firm*—Heslin & Rothenberg, P.C.

[57] ABSTRACT

A method is provided for filling undesired sublithographic contact hole defects in a semiconductor structure caused by misalignment and undesirable overlap of metal line images over contact openings during photolithographic patterning. Unwanted contact between conductive metallization levels through these defects is thereby diminished. The method also provides self-alignment of the lines and contact holes for subsequent formation of stud via connections through which contact is desired to underlying metallization levels. Deposition of a conformal sacrificial material film fills the small, undesired sublithographic contact hole image formed and covers both mask surfaces through which the misaligned line image and contact opening were etched. Isotropic etching removes the conformal layer from all planar surfaces except those of the undesired sublithographic contact hole image. Translation into the underlying insulating layer results in the formation of only contact holes through which contact with underlying substrate metallization is desired. The method of the present invention may alternatively be practiced after the undesired sublithographic contact hole image is etched into the insulating layer to the underlying substrate metallization. Translation of sublithographic defects in a single mask layer overlying an insulating layer disposed over a substrate having metallization therein can also be avoided.

18 Claims, 7 Drawing Sheets

SELF-ALIGNED METALLURGY

TECHNICAL FIELD

The present invention relates generally to a method for semiconductor device fabrication, and more particularly, to a method that fills sublithographic metal contact hole defects caused by misalignment and undesirable overlap of high density metal lines in multi-level semiconductor devices. The method also provides self-alignment of the lines and contact holes through which contact is desired to underlying metallization levels.

BACKGROUND ART

The formation of closely-spaced integrated circuits on the same silicon wafer is well-known, as is technology for conductive interconnection of such circuits. Traditional interconnection techniques use patterned wire metallurgy to form desired wiring levels. In VLSI devices, metal patterns are multi-layered and separated by layers of insulating material. Interconnection between different levels of metal wiring patterns is made by contact holes (or vias), which are etched through the layer of insulating material and filled with metallization to form stud via connections.

As described in U.S. Pat. No. 4,789,648 to Chow et al., which is assigned to the same assignee as the present application, patterned conductive lines may be formed simultaneously with stud via connections through an insulating layer to underlying metallization in multilevel VLSI chips. FIG. 1 shows a semiconductor structure 10 in which a first insulating layer 15 is deposited over a patterned metallization level 20 to which contact is desired. Contact holes or vias 25, which will then be used to form a stud via connection, are defined by photolithography in a first mask layer 30, such as an etch stop material or photoresist, covering first insulating layer 15. A second insulating layer 115 is deposited onto first mask layer 30 followed by a second mask layer (not shown), which may be a photoresist or etch stop material, on second insulating layer 115. Second insulating layer 115 is etched by photolithography to first mask layer 30 to define desired wiring lines or grooves 40 and 50, some of which are in alignment with the previously formed contact holes 25. Alignment is facilitated by standard alignment means. Where contact holes 25 are exposed, the etching is continued into the first layer of insulation 15 to uncover underlying substrate metallization level 20. Where no contact hole is needed, etching stops on first mask layer 30, and second mask layer (not shown) is removed. Lines 40 and 50 and contact holes 25 are then overfilled with metallization, and the excess metallization is removed by etching or chemical mechanical polishing techniques. Device 10 having metallization lines 140 and stud via connections 130 is thereby formed. The etch and mask sequences and subsequent metal deposition and planarization techniques disclosed above are generally known as damascene techniques when one mask is used or dual damascene techniques when two masks are used.

In an alternative dual damascene embodiment (not shown), second insulating layer 115 is not deposited onto first mask layer 30. Instead, a second mask layer, comprising a photoresist or an etch stop material, is placed directly on first mask layer 30. Where no contact hole is exposed, lines 40 and 50 are etched through second mask layer, underlying first mask layer 30, and about half way through first insulating layer 15. Contact holes 25 are defined through first insulating layer 15 where line 40 is aligned with a previously etched contact opening. Both masks are then removed, and the process continues as above with the deposition of a metal into the lines and contact holes.

In a multi-level device in which each level contains various conductive elements, inadvertent contact between levels can lead to electrical shorts and failure of the semiconductor device. For example, in a given device, some of the conductive metallization elements on a lower level are designed to contact conductive metallization elements on an adjacent upper level, while other level conductive metallization elements perform different functions and must remain isolated from upper level elements which happen to be situated immediately above them.

As used below, especially in the dual damascene structures described herein, the term "line image" refers to the openings 40 and 50 defined in the second mask layer overlying first mask layer 30, prior to translation through first mask layer 30 and into first insulating layer 15. "Lines" or "grooves" refer to the openings underlying the line images 50 that are etched through first mask layer 30 and into first insulating layer 15 and subsequently filled with metal to form metallization lines or conductive metallization elements. The term "contact opening" refers to the opening initially etched into first mask layer 30 which may be subsequently filled with a second mask layer prior to line image formation. The term "contact hole image" or "via image" refers to the opening defined where the line image overlaps or is aligned with the contact opening. The term "contact hole" is the opening underlying the line image/contact opening overlap and translated through first insulating layer 15 to substrate metallization 20. The contact holes are then filled with metal and planarized to form stud via connections. A "space" is the material that laterally separates adjacent metal lines or line images.

FIG. 2 is a top plan view showing a dual damascene structure having a line image/space/line image combination where the line images are defined photolithographically and have a minimum image size, M, for five different cases. In the first case, shown in Section A, the line image 40 is perfectly aligned to the underlying contact opening 100a, and the final contact hole image size 60a has dimensions, M×M. However, perfect alignment is generally not attained due to a bias of Δ and tolerances across the wafer that exist in creating both the line image 40 and contact opening 100a. Section B shows a worst case alignment in which the overlay of the line image 40 over the contact opening 100b is half the minimum image size, or M/2, as illustrated in the final contact hole image 60b. For example, for a 1 μ×1 μ contact opening 100b, a worst case overlay of about ½μ across the entire wafer would result. The worst case alignment of Section B is further illustrated in FIG. 3 showing a cross-sectional view of the standard dual damascene multiple resist structure 10 taken along line B—B. A first resist 30, used for defining the contact hole 100b, underlies the second resist 35 used for line image 40 and 50 definition. As shown, misalignment of the resist images subtracts from the final size of the contact hole image 60b from M to M/2.

In order to avoid the above-mentioned problem and to ensure maximum contact hole size, the contact opening 100 in first resist 30 is initially made larger, up to about M/2 in both directions along the X-axis to form a contact opening 100 having the dimensions 2M×M. If the contact opening 100c is perfectly aligned with line image 40, the top view shown in Section C of FIG. 2 would be obtained. However, in a worst case misalignment where the overlay is M/2, as seen in Section D, the 2M contact opening 100d simply overlaps an adjoining space 80. Maximum overlap of dimension M is thus achieved between the line image 40 and the contact opening 100d, and the contact hole image 60d has a final size of M×M.

However, in practice, there are size variations in the contact hole images and line images formed in the wafer due to biases and tolerances across the wafer. If either the line image 40 or the contact hole image 60 size increases beyond the minimum image size M due to a bias A, then an unwanted overlap occurs, and hence unwanted contact with the underlying substrate metallization is made when the contact hole image 70 is later translated to the underlying insulator. This is shown in Section E of FIG. 2 and illustrated by contact hole images 60e and 70. For example, if there are variations, due to a bias ($\Delta$) of 0.1 $\mu$, in the width of line images 40 and 50 having the dimensions of 1 $\mu$×100 $\mu$, where M=1 $\mu$, then in some locations of the wafer, the line may have a width of 1.1 $\mu$, and in other locations, a width of 0.9 $\mu$. If an underlying contact opening 100e having the dimensions 2M×M is misaligned with line image 40 having a width of 1.1 $\mu$, a worst case overlay of M/2 may occur such that the contact opening 100e also underlies a small, sublithographic line image area 70 in which contact to the substrate metallization is not wanted. Thus, when the contact hole image 70 is translated into the insulating layer and filled with a metal, undesired contact with the underlying substrate metallization occurs. The term "sublithographic" as used herein refers to an opening that is very much smaller than an opening formed using standard photolithographic patterning techniques, typically about 5% or less but may be as great as 10%.

The unwanted sublithographic contact described above is further illustrated in FIG. 4, which is a standard dual damascene structure 10 showing a cross-section of FIG. 2, Section E, taken along line E—E. Contact opening 100e has a width of 2M. Due to tolerances and bias factors, unwanted overlap 70 exists between line image 50 and contact opening 100e. As stated above, subsequent translation of the sublithographic contact hole image 70 through the underlying insulator 15 to device metallization within the substrate will result in the creation of not only contact holes at points of desired contact, but also very small contact holes, referred to herein as sublithographic, (in the areas of unwanted overlap or contact hole image 70) in which contact to the substrate metallization is not desired. Circuit shorting and failure will then occur when the resulting contact hole is filled with metal. Thus, a method is needed to fill the undesirable sublithographic contact hole images 70 or the sublithographic contact holes that are translated through the insulator 15 prior to metal deposition.

A conventional method for eliminating sublithographic surface defects in the insulating layer overlying a metallization level includes depositing a second insulating film over the first insulator to fill the defects followed by chemical mechanical polishing to planarize the surface. However, if in addition to the undesired sublithographic surface defects, there are contact holes etched through the first insulator that must remain open to underlying metallization, then the aforementioned method is not useful because the desired contact holes would also remain filled with the second insulating film material.

Cronin et al. in U.S. Pat. No. 5,118,382 disclose a method for filling unwanted undercuts in contact holes etched through an insulating layer. The undercut is filled with a layer of silicon dioxide or silicon nitride using chemical vapor deposition techniques. The deposited fill material conformally covers all surfaces including the underlying substrate surface exposed by the contact hole, the top surface of the insulating layer through which the contact hole is etched, the sidewalls of the contact hole, and the undercut. After sputter etching, a non-directional reactive ion plasma etch is used to remove the fill material from all the covered surfaces while leaving the undercut filled. Because the fill material is removed from the contact hole sidewalls and the substrate surface, contact to the substrate metallization through the contact hole is still possible. Thus, where the contact hole is unwanted and sublithographic, the method is ineffective because as well as reopening the larger, desired contact holes, the method also reopens the unwanted sublithographic contact hole to the underlying metallization.

A need therefore exists for a practical method that fills unwanted sublithographic contact hole defects formed in an insulating layer during dual damascene sequencing. Alternatively, a method is desired that prevents translation of such sublithographic contact holes into the insulator by filling the images prior to etching. A method is also desired that fills sublithographic openings formed during lithography or deposition of a single mask layer overlying an insulator. Such a method would diminish the amount of unwanted contact between metallization levels by eliminating stud via connections formed from sublithographic contact holes in the insulator. The method must permit contact holes to remain open where an opening is desired for subsequent metal deposition. In addition, self-alignment of the lines with the desired contact holes is necessary. Finally, the method should be efficient, inexpensive, and easy to practice without adding a complex number of process steps.

SUMMARY OF THE INVENTION

Briefly, in one aspect of the present invention a method is provided for filling undesired sublithographic contact hole images created during photolithography from misalignment and unwanted overlap between the etched line images and contact openings. The method comprises:

(a) depositing a conformal sacrificial material film 1) onto a second mask layer situated over a first mask layer, said first mask layer having a contact opening formed therein, and said first mask layer overlying an insulating layer disposed over a substrate having metallization therein, and 2) into a first line image formed in said second mask layer, said first line image having a minimum dimension M and overlapping said contact opening to create said undesired sublithographic contact hole image, said sacrificial material filling said undesired sublithographic contact hole image; and (b) isotropically etching said conformal sacrificial material film such that said sacrificial material remains only in said undesired sublithographic contact hole image.

Typically, the undesired sublithographic contact hole image has a dimension with a maximum value of about 0.05M. The contact opening has a width of about 2M to ensure that a contact hole is created having a final contact area of about M×M after M/2 misalignment with the line image. The masks may be either photoresists or a nonerodible material such as silicon nitride or aluminum oxide, or one mask may be a photoresist while the other is a nonerodible material.

The sacrificial material used to form the conformal sacrificial material film is an insulator such as parylene, photoresist, or polyimide. The sacrificial material is deposited to form a conformal film having a thickness of greater than or equal to about 0.025M or about half as thick as the width of the undesired sublithographic contact hole image. Isotropic etching techniques such as oxygen plasma etching are employed to remove the conformal sacrificial material film from all surfaces except from the undesired sublithographic contact hole image.

The conformal sacrificial material film may simultaneously be deposited into a second line image adjacent to the aforementioned first line image. The second mask layer laterally separates the second line image from the first line image by a distance N, where N is less than or equal to M. The second line image also overlaps the contact opening creating a desired contact hole image having a minimum dimension equal to M.

In another aspect, the present invention provides a method of forming a desired contact hole image and filling an undesired sublithographic contact hole image during the manufacture of a semiconductor structure. The method comprises:

(a) forming a contact opening in a first mask layer overlying an insulating layer disposed over a substrate having metallization therein;

(b) depositing a second mask layer over said first mask layer and into said contact opening;

(c) forming at least two adjacent line images in a second mask layer overlying said first mask layer, each of said at least two adjacent line images having a minimum dimension M and laterally separated by a distance N less than or equal to M, one of said at least two adjacent line images overlapping said contact opening to create a desired contact hole image of minimum dimension M and a second of at least two adjacent line images overlapping said contact opening to create an undesired sublithographic contact hole image;

(d) depositing a conformal sacrificial material film onto said second mask layer and into each of said at least two adjacent line images, said sacrificial material filling said undesired sublithographic contact hole image; and (e) isotropically etching said conformal sacrificial material film such that said sacrificial material remains only in said undesired sublithographic contact hole image.

The undesired sublithographic contact hole image generally has a dimension with a maximum value of about 0.05M. The contact opening typically has a width of about 2M in order to provide a final contact hole image area of about M×M.

In yet another aspect, the present invention provides a method for manufacturing a semiconductor structure. After the conformal sacrificial material film has been deposited and isotropically etched as described above filling the undesired sublithographic contact hole image, the insulating layer underlying the desired contact hole image may be etched to the underlying substrate to form a contact hole. In addition, the remaining first mask layer underlying both line images can be etched about half way through the insulating layer to form a first and second groove. Both masks are removed, and the conformal sacrificial material filling the undesired sublithographic contact hole image is removed along with the first mask layer. A metal is deposited over the insulating layer and into the contact hole and grooves to form a stud via connection and a first and second metallization line. Excess metal is removed and the stud via connection and metallization lines are coplanarized, typically by chemical mechanical polishing.

In a fourth aspect, the present invention provides a method for filling sublithographic contact holes that have been etched through the underlying insulating layer to the substrate metallization. A conformal sacrificial material film, comprised preferably of an oxide such as silicon dioxide, boron-doped silicon dioxide, or phosphorous-doped silicon dioxide, is deposited onto the insulating layer and into the sublithographic contact hole. Isotropic etching removes the sacrificial material from the insulating layer and all other surfaces but leaves the sacrificial material in the sublithographic contact hole. The undesired sublithographic contact hole, which generally has a dimension with a maximum value of about 0.05M, is created by:

(a) forming a contact opening in a first mask layer overlying an insulating layer disposed over a substrate having metallization therein;

(b) depositing a second mask layer onto said first mask layer and into said contact opening;

(c) forming a first line image in said second mask layer, said first line image having a minimum dimension M and overlapping said contact opening to create an undesired sublithographic contact hole image;

(d) etching said insulating layer underlying said undesired sublithographic contact hole image to said substrate metallization to form an undesired sublithographic contact hole; and (e) removing said first and second masks overlying said insulating layer.

In yet another aspect, the present invention provides a method for filling a sublithographic opening formed in a single mask layer overlying an insulating layer disposed over a semiconductor substrate having metallization therein. A conformal sacrificial material film is deposited onto the single mask layer and into the undesired sublithographic opening, filling the undesired sublithographic opening. Isotropic etching removes the sacrificial material from the single mask layer and all other planar surfaces but leaves the sacrificial material in the undesired sublithographic opening.

The present invention satisfies the need for a method for filling undesired sublithographic contact hole images caused by misalignment and unwanted overlap of line images and contact openings created during photolithography. The method is flexible because it may be performed either prior to translation of the undesired sublithographic contact hole images into the underlying insulating layer or after etching the contact holes. In addition, the method of the present invention includes self-alignment of line images formed over desired contact hole images to provide contact holes having a final contact area of M×M. Thus, formation of stud via connections in the contact holes through which contact with underlying substrate metallization is desired is possible. The method also avoids translation of undesired sublithographic openings or defects created during lithography or deposition of a single mask layer overlying an insulator.

The invention is advantageous because unwanted contact between metallization levels as well as the problems associated therewith, such as circuit shorting and failure can be diminished. Thus, manufacturing costs can be reduced from the discarding of fewer semiconductor devices. Finally, the method is practical and easy to practice because only a few extra processing steps need to be added to the damascene and dual damascene processes already employed by the semiconductor industry.

The foregoing and other objects, features, and advantages of the invention will be apparent from the following more particular description of the preferred embodiments of the invention as illustrated in the accompanying drawings.

BEST MODE FOR CARRYING OUT THE INVENTION

As noted, the present invention provides a method for filling sublithographic metal contact hole defects caused by misalignment and undesirable overlap of high density metal lines with contact openings formed in multi-level semiconductor devices. The method also provides self-alignment of the lines and contact holes through which contact is desired to underlying metallization levels. In particular, a contact opening is formed in a a first mask overlying an insulating layer deposited on a substrate having metallization therein. A line image having minimum dimension, M, is formed in a second mask overlying the first contact opening mask. Due to misalignment of the line image over the contact opening, an unwanted sublithographic contact hole image is created as well as the desired contact hole image underlying an adjacent line image. A deposited conformal sacrificial material film is deposited onto the top surface of the second mask and into the line images, filling the undesired sublithographic contact hole image. Isotropic etching is performed for a time sufficient to remove the conformal sacrificial material film from all planar surfaces including the sidewalls and bottom of the desired contact hole image. Generally, the endpoint of the sacrificial film on the surfaces is monitored, and etching is continued until about 10% additional material is removed from all planar surfaces. This additional etching ensures that the sacrificial material is removed from the desired contact hole image. However, the etching process is discontinued prior to removal of the sacrificial material from the undesired sublithographic opening. When the contact hole images are then translated through the underlying insulating layer, only the desired contact hole is created. Removal of the sacrificial material in the undesired sublithographic contact hole image is accomplished when the mask layers are removed.

Figure 1:
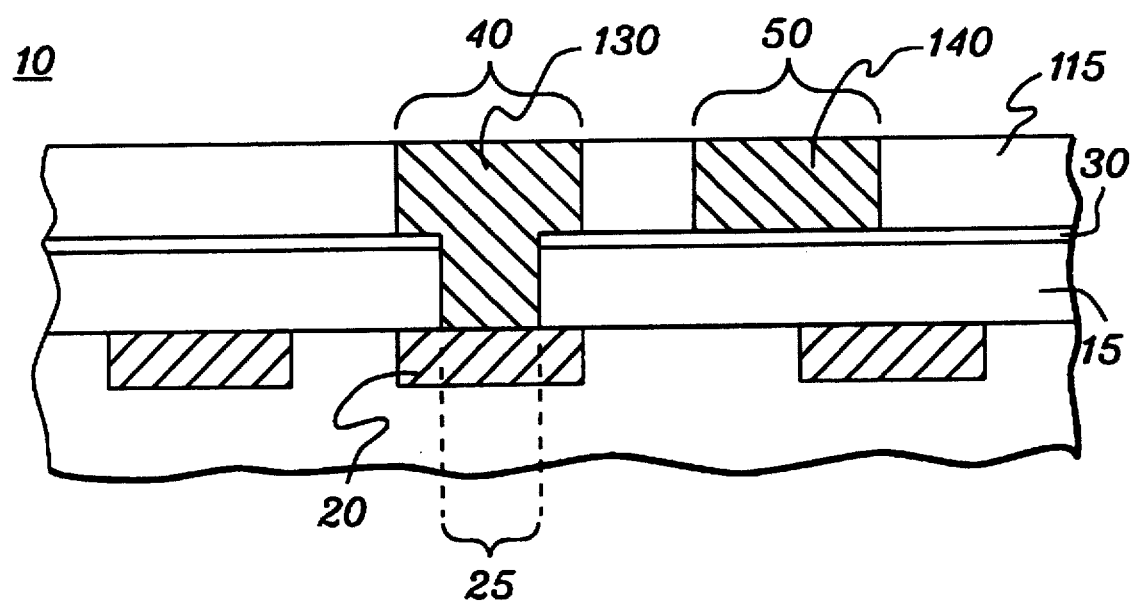
FIG. 1 is a cross section of a portion of a semiconductor structure illustrating a structure formed according to a prior art dual damascening process.
Figure 2:
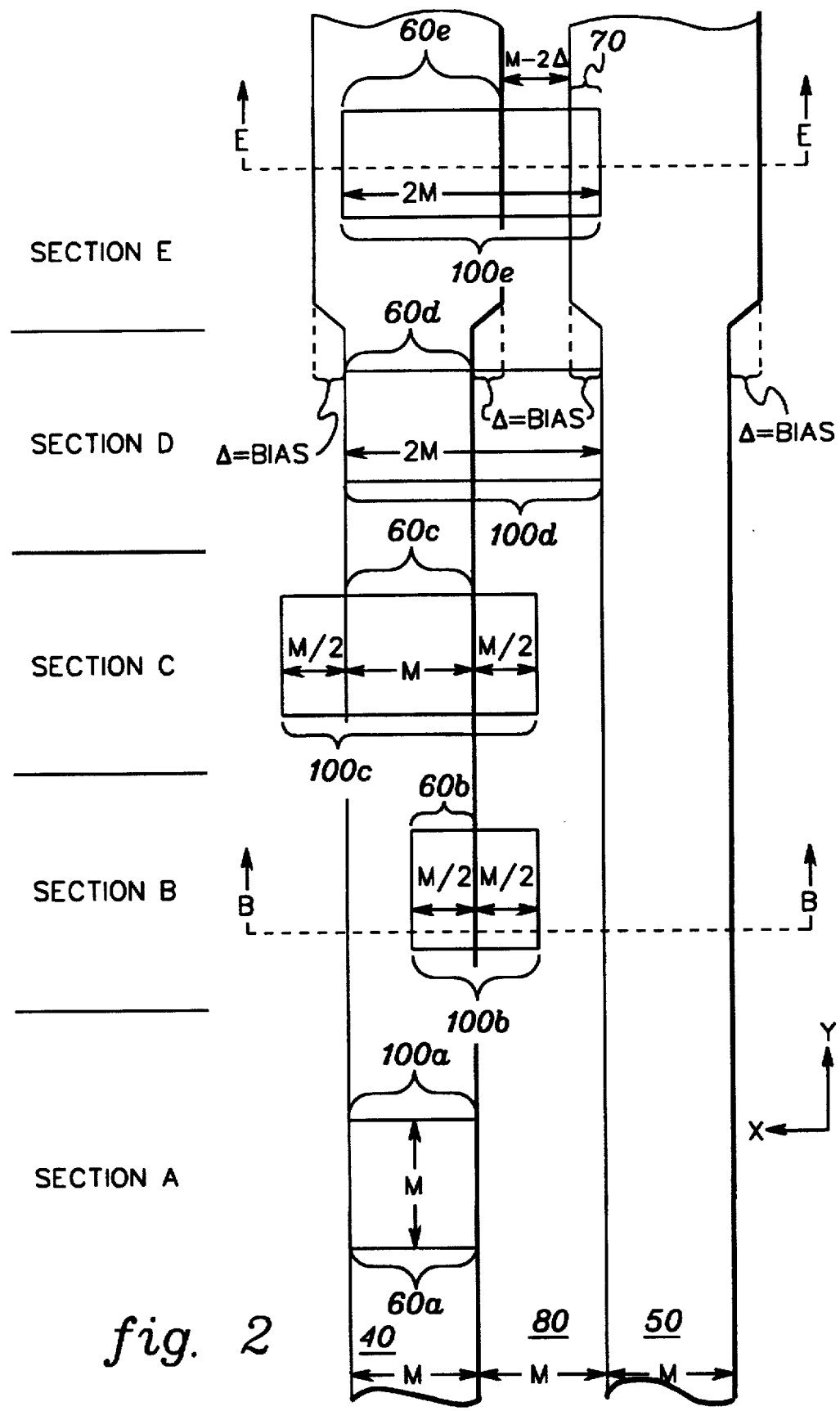
FIG. 2 is a top plan view of a series of dual damascene structures illustrating five different cases of photolithographic imaging in which line images overlap contact openings using a minimum line image size M, as indicated in Sections A through E.
Figure 3:
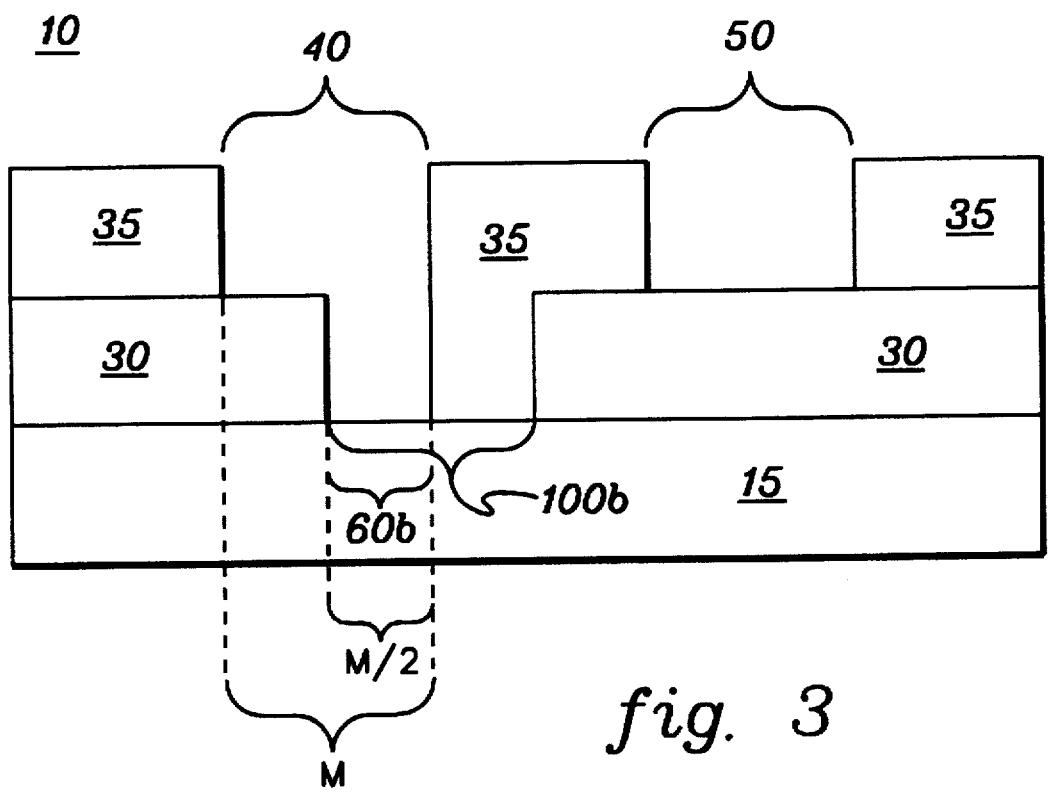
FIG. 3 is a cross section of a portion of a dual damascene structure of FIG. 2, Section B, taken along line B—B illustrating misalignment of a line image over a contact opening of dimension M.
Figure 4:
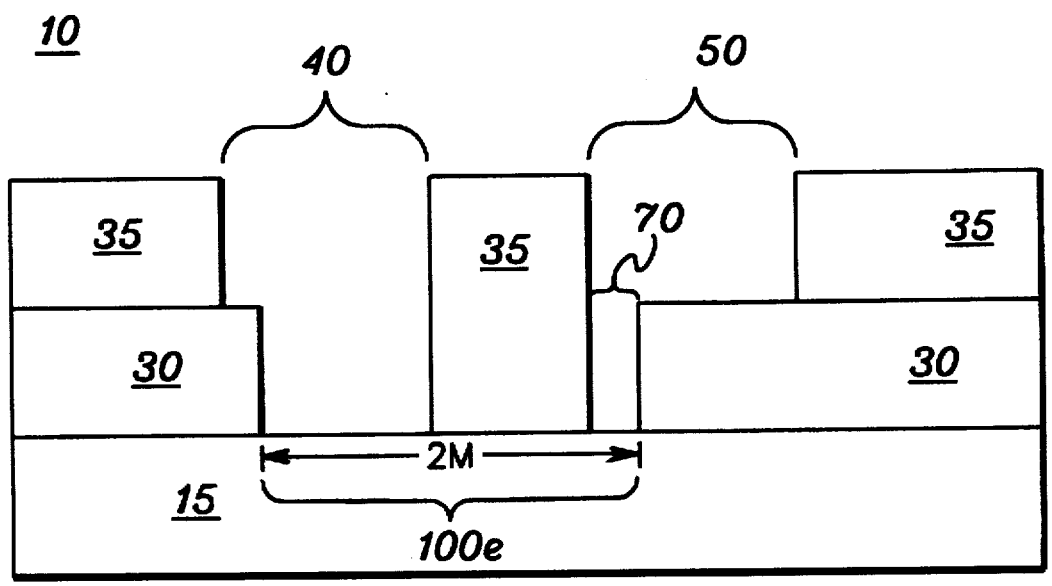
FIG. 4 is a cross section of a portion of a dual damascene structure of FIG. 2, Section E, taken along line E—E illustrating unwanted overlap between a line image and a contact opening of width 2M.
Figure 5:
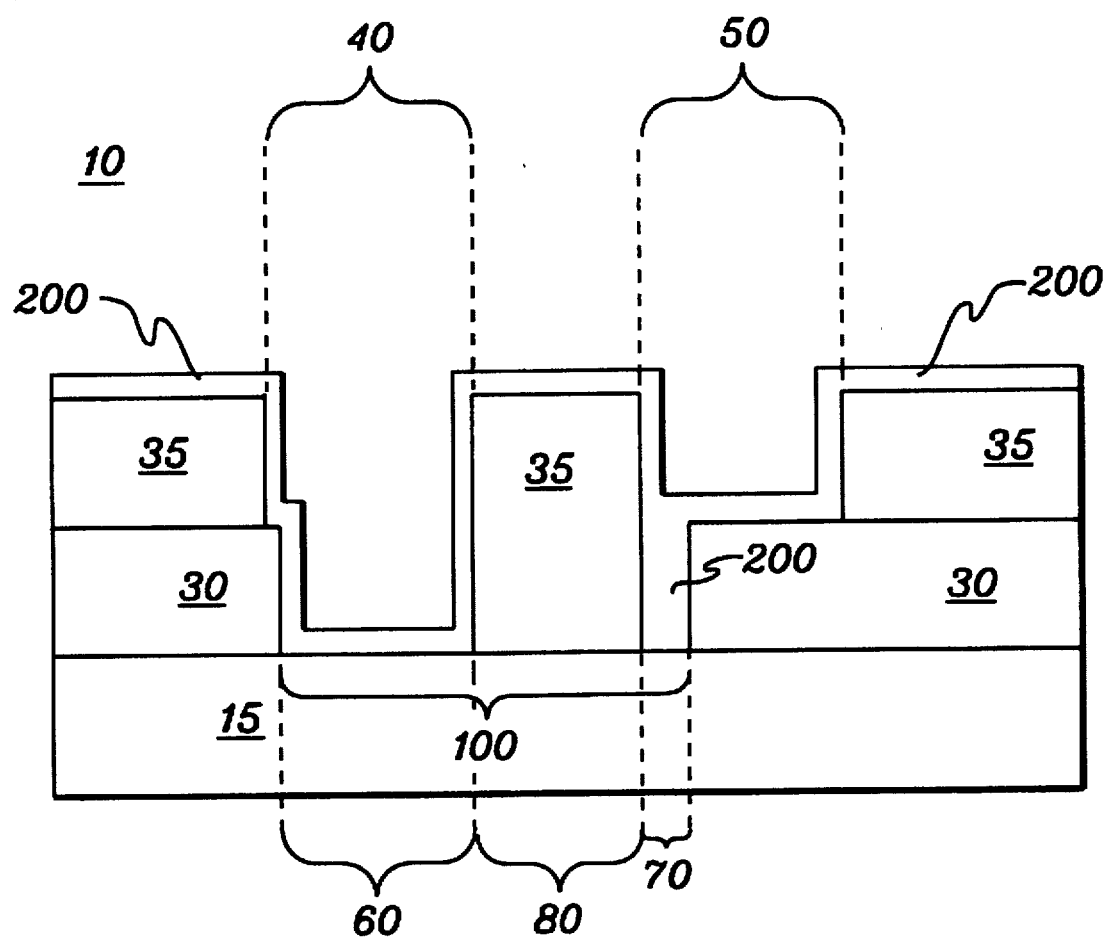
FIG. 5 is a cross section of a portion of a dual damascene structure illustrating the method of the present invention.

Reference should now be made to the drawings in which the same reference numbers are used throughout the different figures to designate the same or similar components. FIG. 5 is a cross-sectional view of a portion 10 of a dual damascene structure illustrating the process of the present invention in which misalignment exists between line images and contact hole images. An insulating layer 15 such as $SiO_2$ overlies the top surface of a substrate having metallization incorporated therein, such as the devices on a VLSI or ULSI integrated circuit chip (not shown). A contact opening 100 generally having a width of about 2M, where M is the minimum line image dimension (see below), is formed in a first mask layer 30 which resides over insulating layer 15. Contact opening 100 is created using conventional photolithography techniques. A second mask layer 35 is then deposited onto first mask layer 30 and into contact opening 100. Thus, portions of insulating layer 15 that were exposed when contact opening 100 was created are covered with second mask layer 35. Line images 40 and 50 of minimum dimension M are thereafter formed in second mask layer 35 using conventional photolithography techniques. First and second mask layers 30 and 35 may be photoresists or nonerodible materials (etch stops). Alternatively, one mask layer may be a photoresist and the other may be a nonerodible material. Examples of nonerodible materials include silicon nitride and aluminum oxide.

Where two adjacent line images, first line image 50 and second line image 40, laterally separated by a distance, N, where N is less than or equal to M, are each aligned over contact opening 100, portions of insulating layer 15 are exposed, and a desired contact hole image 60 of minimum dimension M, and an undesired sublithographic contact hole image 70 are formed. Self-alignment of the second line image 40 and contact opening 100 initially formed therefore results in the desired contact hole image 60. Undesired sublithographic contact hole image 70 is much smaller than desired contact hole image 60, generally having a maximum value of about 5% the size of M or 0.05M. Area 80, having width N, over insulating layer 15 remains covered with second mask layer 35 and laterally separates desired contact hole image 60 from undesired sublithographic contact hole image 70. If translation of both desired and undesired sublithographic contact hole images 60 and 70, respectively, is permitted through insulating layer 15 (not shown) at this point, and metallization is then deposited therein to form stud via connections (not shown), undesired contact with the underlying substrate metallization will occur through the stud via connection corresponding to the undesired sublithographic contact hole image 70.

Therefore, in accordance with the present invention, a conformal film 200 comprising a sacrificial material is deposited onto the remaining second mask layer 35 and onto the exposed surfaces of first line image 50 and second line image 40. Examples of sacrificial materials suitable to form conformal film 200 are insulators such as parylene (poly-p-xylylene), polyimide, and photoresists. A conformal deposition technique, such as chemical vapor deposition for parylene or spin casting for polyimide and photoresists, is typically used to deposit the sacrificial material over the sidewalls of line images 50 and 40, the exposed top surface of first layer mask 30, and the sidewalls and bottom of desired contact hole image 60. In addition, the sacrificial material fills undesired sublithographic contact hole image 70. The thickness of conformal film 200 is generally greater than or equal to about 0.025M. Thus, when M is about 1 µ, and undesired sublithographic contact hole image 70 is about 50 Å, conformal film 200 would be deposited to a thickness of at least about 25 Å, but more practically to about 50 Å to ensure complete filling of undesired contact hole image 70.

Figure 6:
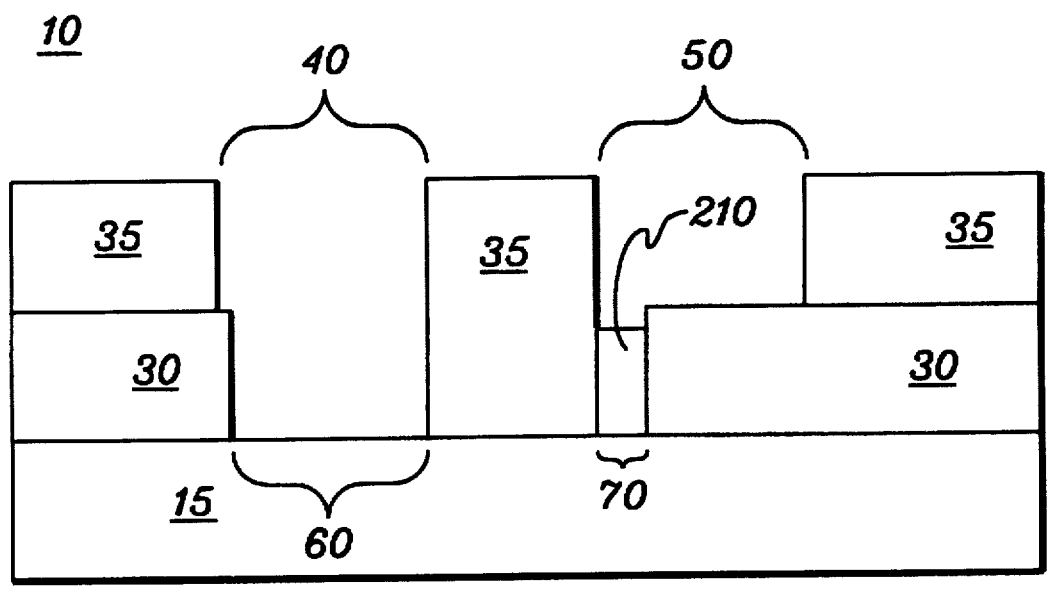
FIG. 6 is a cross section of a portion of a semiconductor structure illustrating the resulting preferred embodiment of FIG. 5 after the conformal sacrificial material layer has been removed from all surfaces except from the sublithographic contact image by isotropic etching according to the method of the present invention.

Conformal film 200 is then isotropically etched and its endpoint monitored for a time sufficient to remove the film from all vertical and horizontal planar surfaces including the bottom and sidewalls of desired contact hole image 60 using a oxygen plasma etch, for example. Endpoint is determined as removing conformal film 200 from all planar surfaces. To ensure that conformal film 200 is completely removed from desired contact hole image 60 and to account for the normal etching variation of about 10% across the wafer (i.e. some surfaces may be overetched while other surfaces are underetched), etching is typically continued to remove about 10% more material beyond the monitored endpoint. However, due to its very small size and the limited duration of the isotropic etch, undesirable sublithographic contact hole image 70 remains filled with the sacrificial material. However, the method of the present invention is not limited to filling undesirable sublithographic contact hole images 70 of maximum dimension 0.05M, and it may be beneficial for larger undesirable contact hole images of up to about 0.10M (not shown) to remain filled with the conformal sacrificial material film 200 after removing film 200 from desired contact hole images 60, as will be obvious to those of ordinary skill in the art. The structure that results after isotropic etching is performed is shown in FIG. 6, which illustrates filled undesirable sublithographic contact hole 210. Note that the remaining sacrificial material in filled hole 210 may be recessed below the top surface of first mask layer 30, as a result of a longer etch, without destroying the effectiveness of the method for filling undesired sublithographic contact holes.

Figure 7:
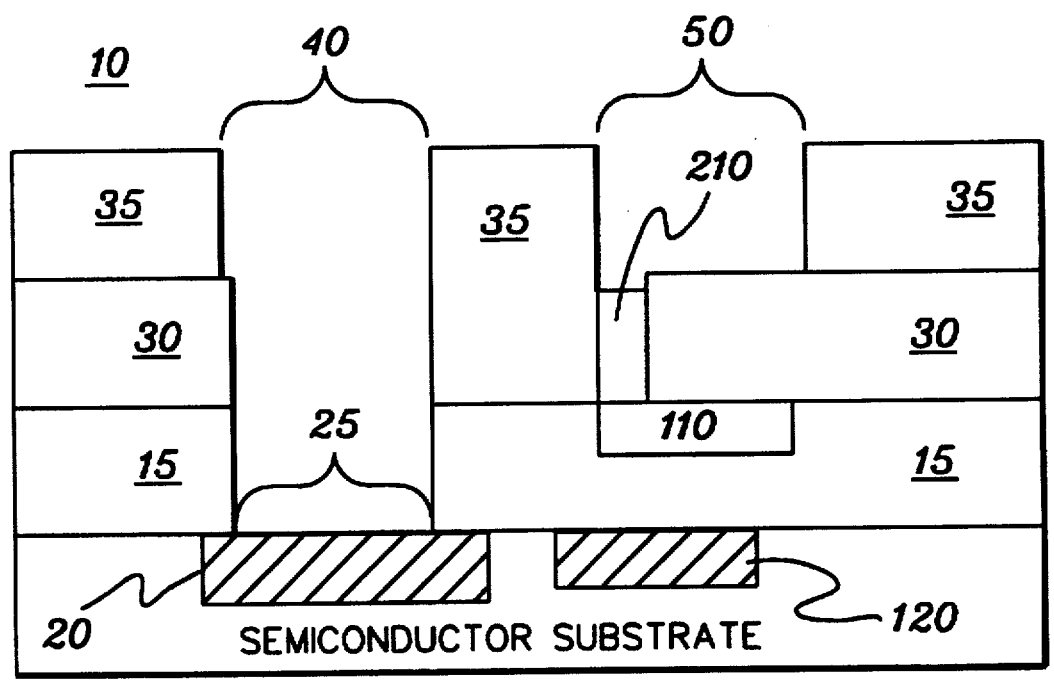
FIG. 7 is a cross section of a portion of a semiconductor structure illustrating the resulting preferred embodiment of FIG. 6 after further processing to form the desired contact hole and grooves in the insulating layer according to the method of the present invention.
Figure 8:
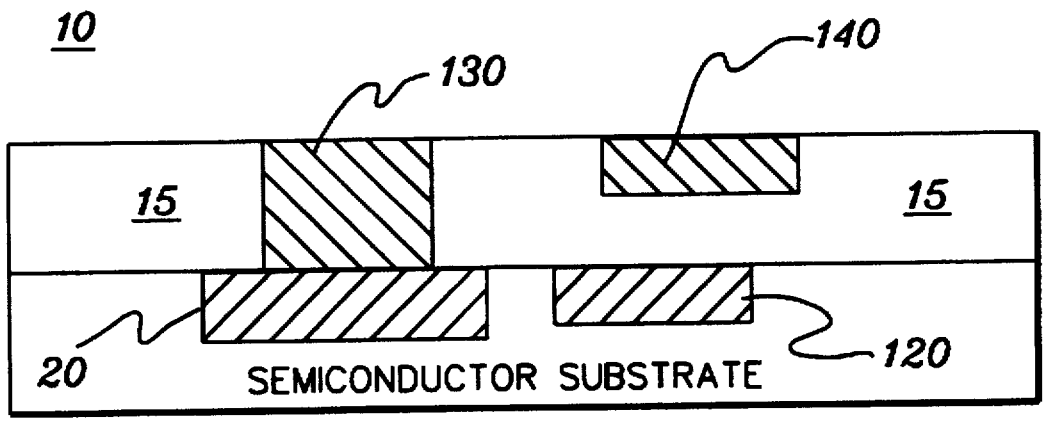
FIG. 8 is a cross section of a portion of a semiconductor structure illustrating the resulting preferred embodiment of FIG. 7 after removal of the first and second masks, deposition of a metal, and removal and coplanarization according to the method of the present invention.

As shown in FIG. 7, damascene processing continues using standard techniques, such as etching, known in the art for translating desired contact hole image 60 (not shown) through underlying insulating layer 15 to the substrate metallization 20. Contact hole 25 is thus formed. In addition, first mask 30 may be etched in locations underlying line images 50 and 40 that are not in alignment with contact opening 100 that was initially formed (not shown). In these locations, etching continues about half way through insulating layer 15 creating a first groove 110 underlying first line image 50, and a second groove (not shown) underlying second line image for subsequent metallization line formation. Second mask layer 35 and first mask layer 30 are then removed using standard reactive ion etching techniques. The sacrificial material in filled hole 210 is removed when first mask layer 30 is removed. After depositing a metal, such as aluminum or tungsten (not shown), for example, into the translated contact hole 25 and grooves 110, desired stud via connections 130 and metallization lines 140 are made, as illustrated in FIG. 8. Unwanted contact between overlying metallization lines (not shown) and the underlying substrate metallization 120 is therefore avoided while the desired contact with metallization 20 through stud via connection 130 is provided. Excess metallization on the surface of insulating layer 15 is then removed, typically using chemical mechanical polishing techniques which also coplanarizes metallization line 140 and stud via connection 130 with insulating layer 15. The final semiconductor structure portion 10 is shown in FIG. 8. The method of the present invention can then be used along with standard techniques known in the art to create multi-level metallization patterns and insulating layers to form typical VSLI and USLI structures.

Figure 9:
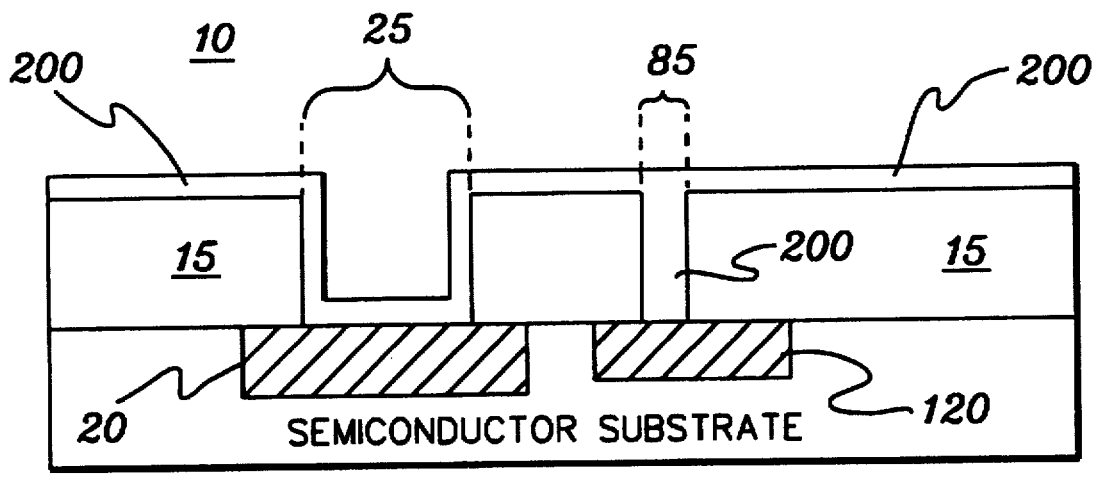
FIG. 9 is a cross section of a portion of a semiconductor structure illustrating the method of the present invention when an undesired sublithographic contact hole is defined in the insulating layer.
Figure 10:
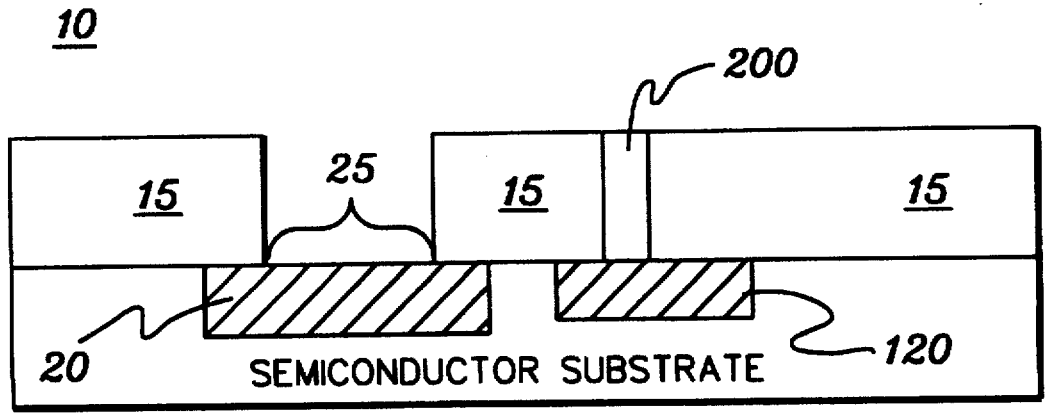
FIG. 10 is a cross section of a portion of a semiconductor structure illustrating the resulting preferred embodiment of FIG. 9 after removing the conformal sacrificial material film from all surfaces but the undesired sublithographic contact hole by isotropic etching according to the method of the present invention.

In an alternative embodiment, as shown in FIG. 9, the process of the present invention can also be used after the undesired sublithographic contact hole 85 has been etched into underlying insulating layer 15, and the masks have been removed. The conformal sacrificial material film 200, typically an oxide such as silicon dioxide, phosphorous-doped silicon dioxide, or boron-doped silicon dioxide, is deposited onto the insulating layer 15 and into the undesired sublithographic contact hole 85. The conformal sacrificial material film 200 is also deposited onto the exposed surfaces of any desired contact holes 25 etched into insulating layer 15. Insulating layer 15 is also typically an oxide such as silicon dioxide, phosphorous-doped silicon dioxide, or boron-doped silicon dioxide. However, the invention is not limited to the aforementioned oxides, and other materials may be used to form insulating layer 15 and the conformal sacrificial material film 200. After isotropic etching as described above, the undesired sublithographic contact hole 85 remains filled with the sacrificial oxide, due to its small size and the limited duration of the etching, as shown in FIG. 10. The sacrificial oxide is removed from any contact holes 25 also formed in insulating layer 15 having a size greater than about 0.05M. However, the method of the present invention is not limited to filling undesirable sublithographic contact holes 85 of maximum dimension 0.05M, and it may be beneficial for larger undesirable contact holes of up to about 0.10M (not shown) to remain filled with the conformal sacrificial material film 200 after removing film 200 from desired contact holes 25, as will be obvious to those of ordinary skill in the art. Subsequent metal deposition (not shown) will therefore fill only the desired contact holes 25 providing a stud via connection with underlying substrate metallization 20. No connection will be made to substrate metallization 120 through the filled sublithographic contact hole.

Figure 11:
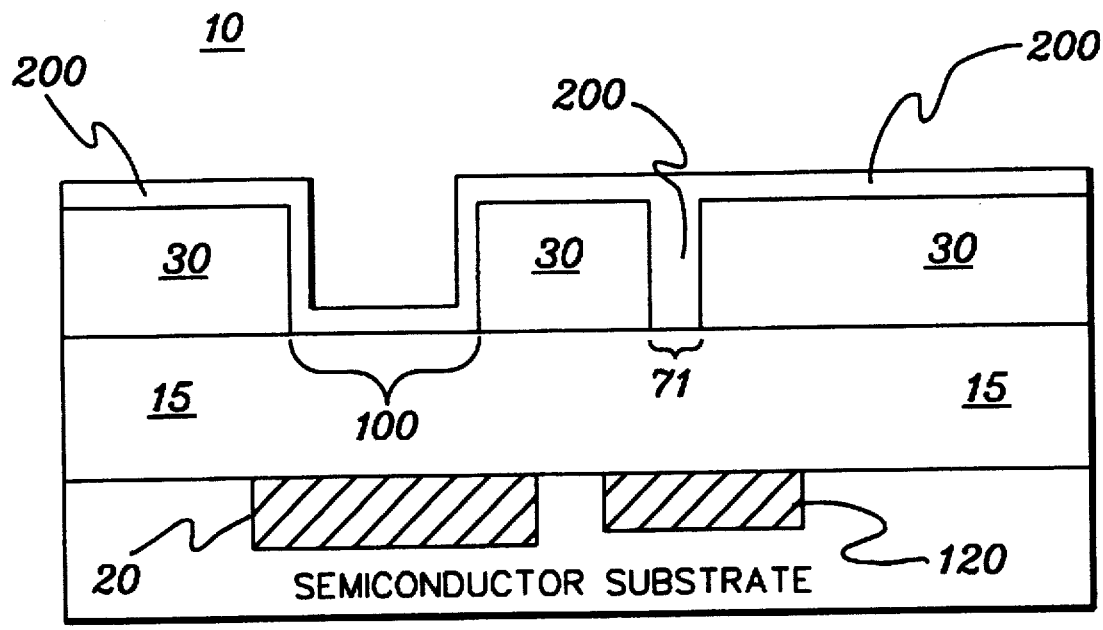
FIG. 11 is a cross section of a portion of a semiconductor structure illustrating the method of the present invention when an undesired sublithographic opening is found in a single mask layer overlying the insulating layer.
Figure 12:
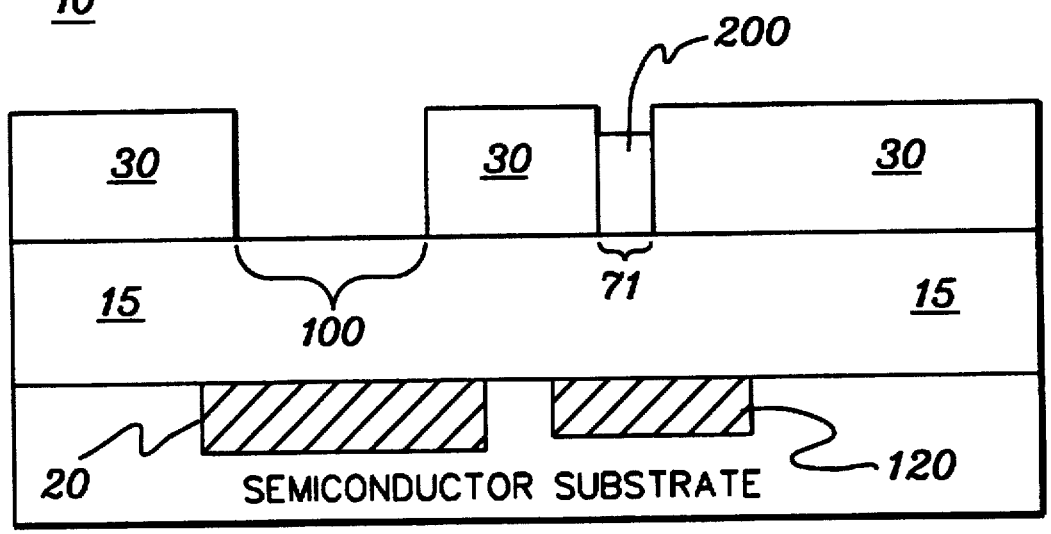
FIG. 12 is a cross section of a portion of a semiconductor structure illustrating the resulting preferred embodiment of FIG. 11 after removing the conformal sacrificial material film from all planar surfaces except the undesired sublithographic opening by isotropic etching according to the method of the present invention.

In yet another embodiment, as shown in FIG. 11, the process of the present invention can also be performed to remove an undesired sublithographic void or opening 71 created in a single mask layer 30 overlying insulating layer 15, which is disposed over a semiconductor substrate having metallization 20 and 120 therein. For example, in addition to producing lithographic contact opening 100, undesired sublithographic opening 71, which is typically about 5% the size of contact opening 100, but may be as great as 10%, may be produced during photolithography due to defects in the originally deposited mask layer 30. During development, a sublithographic portion of mask layer 30 may be removed creating sublithographic opening 71. Alternatively, the originally deposited single mask layer 30 may already have sublithographic voids or openings 71 contained therein. To avoid unwanted translation of sublithographic opening 71 through insulating layer 15, and subsequent contact with metallization 120, conformal sacrificial material film 200 comprising parylene (poly-p-xylylene), polyimide, or a photoresist is deposited over mask layer 30 and the exposed surfaces of contact opening 100, filling sublithographic opening 71. Conformal film 200 is then isotropically etched and its endpoint monitored for a time sufficient to remove the film from all vertical and horizontal planar surfaces including the bottom and sidewalls of contact opening 100 using a oxygen plasma etch, for example. Etching is typically continued to remove about 10% more material beyond the monitored endpoint leaving undesired sublithographic opening 71 filled with the sacrificial material. The structure that results after isotropic etching is performed is shown in FIG. 12. Again, the remaining sacrificial material 200 in sublithographic opening 71 may be recessed below the top surface of mask layer 30, as a result of a longer etch, without destroying the effectiveness of the method for filling undesired sublithographic defects or openings. Damascene processing continues using standard techniques, such as etching, known in the art for translating (not shown) contact opening 100 through underlying insulating layer 15 to the substrate metallization 20. Mask layer 30 is then removed as well as the sacrificial material in sublithographic opening 71, followed by metallization and planarization (not shown).

Therefore, in accordance with the present invention, filling undesired sublithographic contact hole images with sacrificial material eliminates translation of undesired sublithographic contact holes while maintaining the M×M contact area of desired contact holes. In addition, where undesired sublithographic contact holes have been translated into the underlying insulating layer, contact with substrate metallization can be avoided by filling the small holes with an oxide, such as silicon dioxide. Finally, translation of sublithographic defects or openings found in a single mask layer can be avoided.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

We claim:

1. A method for filling an undesired sublithographic contact hole image formed during the manufacture of a semiconductor structure, said method comprising the steps of:
   (a) depositing a conformal sacrificial material film 1) onto a second mask layer situated over a first mask layer, said first mask layer having a contact opening formed therein, and said first mask layer overlying an insulating layer disposed over a substrate having metallization therein, and 2) into a first line image formed in said second mask layer, said first line image having a minimum dimension M and overlapping said contact opening to create said undesired sublithographic contact hole image, said sacrificial material filling said undesired sublithographic contact hole image; and
   (b) isotropically etching said conformal sacrificial material film such that said sacrificial material remains only in said undesired sublithographic contact hole image.

2. The method according to claim 1, wherein said undesired sublithographic contact hole image has a dimension with a maximum value of about 0.05M.

3. The method according to claim 1, wherein said contact opening has a dimension of about 2M.

4. The method according to claim 1, wherein said first mask comprises a photoresist.

5. The method according to claim 1, wherein said second mask comprises a photoresist.

6. The method according to claim 1, wherein said first mask comprises a nonerodible material selected from the group consisting of silicon nitride and aluminum oxide.

7. The method according to claim 1, wherein said second mask comprises a nonerodible material selected from the group consisting of silicon nitride and aluminum oxide.

8. The method according to claim 1, wherein said conformal insulating film is deposited to a thickness greater than or equal to about 0.025M.

9. The method according to claim 1, wherein said conformal insulating film comprises a material selected from the group consisting of parylene, photoresists, and polyimide.

10. The method according to claim 1, wherein said conformal sacrificial material is isotropically etched using an oxygen plasma etching technique.

11. The method according to claim 1, wherein step (a) further comprises:
    depositing said conformal sacrificial material film into an adjacent second line image formed in said second mask layer, said second line image having a minimum dimension M and separated laterally from said first line image by a distance N less than or equal to M, said second line image overlapping said contact opening to create a desired contact hole image having a minimum dimension M.

12. The method according to claim 11, further comprising the steps of:
    (c) etching said insulating layer underlying said desired contact hole image to said substrate to form a contact hole;
    (d) removing said second mask;
    (e) removing said first mask and said conformal sacrificial material film remaining in said undesired sublithographic contact hole image;
    (f) depositing a metal onto said insulating layer and into said contact hole to form a stud via connection;
    (g) removing said metal overlying said insulating layer while said metal remains in said stud via connection; and
    (h) coplanarizing said metal in said stud via connection with said insulating layer.

13. The method according to claim 12 further comprising between steps (c) and (d) the steps of etching said first mask layer and said insulating layer underlying said first line image to a point about half way through said insulating layer to form a first groove, and etching said first mask layer and said insulating layer underlying said adjacent second line image to a point about half way through said insulating layer to form a second groove.

14. The method according to claim 13, wherein said depositing step (f) further comprises depositing said metal into said first groove and said second groove to form a first metallization line and a second metallization line, wherein said metal also remains in said first and second metallization lines after said removing step (g), and wherein said coplanarizing step (h) further comprises coplanarizing said metal in said first and second metallization lines with said stud via connection and said insulating layer.

15. The method according to claim 12, wherein said removing step (g) and said coplanarizing step (h) are performed using chemical mechanical polishing.

16. A method of forming a desired contact hole image and filling an undesired sublithographic contact hole image during the manufacture of a semiconductor structure, said method comprising the steps of:

(a) forming a contact opening in a first mask layer overlying an insulating layer disposed over a substrate having metallization therein;

(b) depositing a second mask layer over said first mask layer and into said contact opening;

(c) forming at least two adjacent line images in a second mask layer overlying said first mask layer, each of said at least two adjacent line images having a minimum dimension M and laterally separated by a distance N less than or equal to M, one of said at least two adjacent line images overlapping said contact opening to create a desired contact hole image of minimum dimension M and a second of at least two adjacent line images overlapping said contact opening to create an undesired sublithographic contact hole image;

(d) depositing a conformal sacrificial material film onto said second mask layer and into each of said at least two adjacent line images, said sacrificial material filling said undesired sublithographic contact hole image; and (e) isotropically etching said conformal sacrificial material film such that said sacrificial material remains only in said undesired sublithographic contact hole image.

17. The method according to claim 16, wherein said undesired sublithographic contact hole image has a dimension with a maximum value of about 0.05M.

18. The method according to claim 16, wherein said contact opening has a dimension of about 2M.

* * * * *